United States Patent
Xie et al.

(10) Patent No.: US 11,495,437 B2
(45) Date of Patent: Nov. 8, 2022

(54) SURFACE PRETREATMENT PROCESS TO IMPROVE QUALITY OF OXIDE FILMS PRODUCED BY REMOTE PLASMA

(71) Applicants: Mattson Technology, Inc., Fremont, CA (US); Beijing E-Town Semiconductor Technology Co., Ltd., Beijing (CN)

(72) Inventors: Ting Xie, Fremont, CA (US); Xinliang Lu, Fremont, CA (US); Hua Chung, Saratoga, CA (US); Michael X. Yang, Palo Alto, CA (US)

(73) Assignees: BEIJING E-TOWN SEMICONDUCTOR TECHNOLOGY, CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 336 days.

(21) Appl. No.: 16/878,661

(22) Filed: May 20, 2020

(65) Prior Publication Data
US 2020/0373129 A1    Nov. 26, 2020

Related U.S. Application Data

(60) Provisional application No. 62/850,750, filed on May 21, 2019.

(51) Int. Cl.
*H01J 37/32*     (2006.01)
*H01L 21/02*     (2006.01)

(52) U.S. Cl.
CPC ...... *H01J 37/32357* (2013.01); *H01J 37/321* (2013.01); *H01J 37/3244* (2013.01);
(Continued)

(58) Field of Classification Search
None
See application file for complete search history.

(56) References Cited

U.S. PATENT DOCUMENTS

| 5,412,246 A | 5/1995 | Dobuzinsky et al. |
| 7,064,084 B2 | 6/2006 | Hishiya et al. |
(Continued)

FOREIGN PATENT DOCUMENTS

KR    20070049268    5/2007

OTHER PUBLICATIONS

PCT International Search Report and Written Opinion for corresponding PCT Application No. PCT/US2020/033780, dated Sep. 15, 2020—11 pages.

*Primary Examiner* — Alexander G Ghyka
(74) *Attorney, Agent, or Firm* — Dority & Manning, P.A.

(57) ABSTRACT

Processes for oxidation of a workpiece are provided. In one example, a method includes placing a workpiece on a workpiece support in a processing chamber. The method includes performing a pre-oxidation treatment process on the workpiece in the processing chamber to initiate oxide layer formation on the workpiece. The method includes performing a remote plasma oxidation process on the workpiece in the processing chamber to continue the oxide layer formation on the workpiece. Subsequent to performing the pre-oxidation treatment process and the remote plasma oxidation process, the method can include removing the workpiece from the processing chamber. In some embodiments, the remote plasma oxidation process can include generating a first plasma from a remote plasma oxidation process gas in a plasma chamber; filtering species generated in the plasma to generate a mixture having one or more radicals; and exposing the one or more radicals to the workpiece.

20 Claims, 11 Drawing Sheets

(52) U.S. Cl.
CPC .. *H01J 37/32743* (2013.01); *H01L 21/02238* (2013.01); *H01L 21/02252* (2013.01); *H01L 21/02304* (2013.01); *H01L 21/02315* (2013.01)

(56) References Cited

U.S. PATENT DOCUMENTS

| | | |
|---|---|---|
| 8,207,044 B2 | 6/2012 | Mani et al. |
| 8,580,354 B2 | 11/2013 | Fu et al. |
| 9,881,805 B2 | 1/2018 | Li et al. |
| 2004/0087180 A1 | 5/2004 | Hishiya et al. |
| 2006/0174833 A1 | 8/2006 | Yamazaki et al. |
| 2011/0217850 A1 | 9/2011 | Mani et al. |
| 2016/0260616 A1 | 9/2016 | Li et al. |

SURFACE PRETREATMENT PROCESS TO IMPROVE QUALITY OF OXIDE FILMS PRODUCED BY REMOTE PLASMA

PRIORITY CLAIM

The present application claims the benefit of priority of U.S. Provisional Application Ser. No. 62/850,750 filed on May 21, 2019, titled "Surface Pretreatment Process to Improve Quality of Oxide Films Produced by Remote Plasma," which is incorporated herein by reference.

FIELD

The present disclosure relates generally to surface treatment of a workpiece, and more particularly to surface treatment of a workpiece to improve quality of oxide films produced by remote plasma oxidation processes.

BACKGROUND

Plasma processing is widely used in the semiconductor industry for deposition, etching, resist removal, surface treatment and related processing of semiconductor wafers and other substrates. Plasma sources (e.g., microwave, ECR, inductive, etc.) are often used for plasma processing to produce high density plasma and reactive species for processing substrates

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method includes placing a workpiece on a workpiece support in a processing chamber. The method includes performing a pre-oxidation treatment process on the workpiece in the processing chamber to initiate oxide layer formation on the workpiece. The method includes performing a remote plasma oxidation process on the workpiece in the processing chamber to continue the oxide layer formation on the workpiece. Subsequent to performing the pre-oxidation treatment process and the remote plasma oxidation process, the method can include removing the workpiece from the processing chamber. In some embodiments, the remote plasma oxidation process can include generating a first plasma from a remote plasma oxidation process gas in a plasma chamber; filtering species generated in the plasma to generate a mixture having one or more radicals; and exposing the one or more radicals to the workpiece.

Other example aspects of the present disclosure are directed to systems, methods, and apparatus for selective deposition of a material on workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
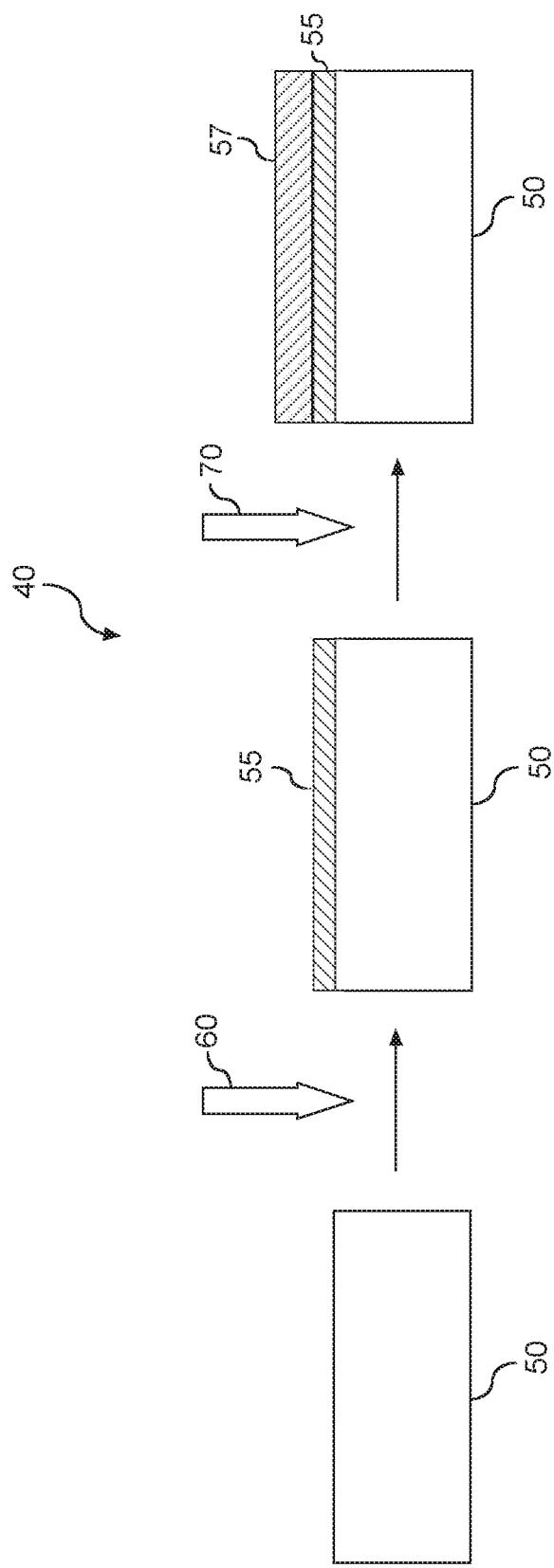
FIG. 1 depicts an example oxidation process according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to systems and methods for processing a workpiece to improve the quality of oxide films formed on the workpiece as a result of remote plasma based oxidation. For instance, pre-treatment oxidation processes can be performed on a workpiece prior to a remote plasma oxidation process to improve the quality of oxide film formed during the remote plasma oxidation process.

Device dimension and materials thickness continue to decrease with shrinking critical dimensions in semiconductor devices. In advanced device nodes, material properties and interface integrity become increasingly important to the device performance. In many cases, the oxidation process of silicon (e.g., to form $SiO_2$) dominates the quality of semiconductor devices due to the role that oxide plays in the semiconductor devices as insulating layers.

Among several oxidation processes, remote plasma or decoupled plasma oxidation processes can have certain advantages over others (e.g., thermal oxidation) in the low-temperature process domain (e.g., less than about 400°

C.). Remote plasma oxidation processes can be used towards the manufacture and integration of nanometer scale semiconductor devices. In this regard, quality of remote plasma deposited oxide is a factor in meeting specifications of advanced semiconductor devices.

As used herein "quality" of an oxide film can be quantified by its diluted hydrofluoride (DHF) etch rate. A typical 100:1 DHF rate for a thermal oxide is around 15 Angstroms/minute. A remote plasma oxide etch rate can be, for instance, around 100 Angstroms/min. Faster DHF etch rates can indicate higher quality of oxide films.

Some methods for improving quality of oxide films can involve the use of high temperatures (e.g., greater than about 400° C.) or a high dose of ions (e.g., He+ ions) to densify the oxide film after the oxidation process. These techniques can break weak bonds in the oxide film by transferring thermal and/or connecting energy to the oxide film. However, these techniques can lead to device damage during semiconductor device manufacturing processes. For instance, high temperature can cause material diffusion and/or induce large thermal stress. A high dosage of ions can result in materials sputtering and/or redeposition, leading to rough surface and debris on the device.

According to example aspects of the present disclosure, a pre-oxidation treatment process can be performed on the workpiece prior to a remote plasma oxidation process to improve the quality of oxide films formed during the remote plasma oxidation process. In some example implementations, the pre-oxidation treatment process can initiate oxide formation by forming a thin layer of pristine quality oxide (e.g., comparable to or better than oxide films formed using thermal oxidation processes). The thin layer of pristine quality oxide can serve as an oxidation template for the latter remote oxidation process. The pre-oxidation treatment process can be performed in situ in the same processing chamber as the remote plasma oxidation process. In this way, aspects of the present disclosure can provide an effective solution to improve oxide film quality in low temperature regimes without risking device damage with ions.

The remote plasma oxidation process can include, for instance, generating a plasma from a process gas in a plasma chamber. The process gas can include, for instance, a mixture comprising $H_2$ and $O_2$ or a mixture comprising a $H_2O$ and $O_2$. The process can include filtering species (e.g., ions) generated in the plasma using a separation grid separating the plasma chamber from a processing chamber. Radicals (e.g., O radicals and/or OH radicals) can pass through the separation grid for exposure to the workpiece to form an oxide layer on the workpiece.

Prior to performing the remote plasma oxidation process, a pre-oxidation treatment process can be performed in situ (e.g., in the same processing chamber as the remote plasma oxidation process) to initiate oxide formation on the workpiece. In some embodiments, the pre-oxidation treatment process can include exposing the workpiece to a pretreatment gas in the processing chamber. For instance, the pretreatment gas can be provided to the processing chamber (e.g., without plasma) from the plasma chamber and/or from gas injection ports in the processing chamber. The pretreatment gas can be, for instance, $O_3$ gas. The pretreatment gas can be, for instance, $O_2$ gas. In some embodiments, the pretreatment gas can be a mixture of $O_2$ gas and $O_3$ gas.

In some embodiments, the pre-treatment oxidation process can include exposing the workpiece to radicals generated from a plasma in the plasma chamber. For instance, the pre-treatment process can include generating species by inducing a plasma in a pre-oxidation treatment gas in the plasma chamber. The pre-oxidation treatment gas can be, for instance, for instance, $O_2$ gas. The pretreatment gas can be, for instance, $O_3$ gas. In some embodiments, the pretreatment gas can be a mixture of $O_2$ gas and $O_3$ gas. The pre-treatment oxidation process can include filtering one or more species (e.g., ions) to generate a filtered mixture and exposing the filtered mixture to the workpiece to initiate oxide layer formation on the workpiece. For instance, a separation grid can filter ions generated in the plasma and pass through radicals O radicals) to initiate formation of a high quality oxide layer on the workpiece.

Aspects of the present disclosure can provide a number of technical effects and benefits. For instance, the pre-treatment oxidation process can be performed in situ in the same processing chamber as the remote plasma oxidation process, leading to reduced workpiece transfer time and increased throughput in semiconductor device manufacturing. The pre-treatment oxidation process can lead to significant improvement in oxide quality without requiring elevated temperatures. Moreover, the effectiveness of the pre-treatment oxidation process can be finely tuned by adjusting process parameters, such as process temperature, gas flow rates/concentrations, process time, pressure, and RF power for the inductively coupled plasma source.

Aspects of the present disclosure are discussed with reference to a "workpiece" or semiconductor wafer for purposes of illustration and discussion. Those of ordinary skill in the art, using the disclosures provided herein, will understand that the example aspects of the present disclosure can be used in association with any semiconductor substrate or other suitable substrate or workpiece. In addition, the use of the term "about" in conjunction with a numerical value is intended to refer to within ten percent (10%) of the stated numerical value.

FIG. 1 depicts an overview of an example oxidation process 40 according to example embodiments of the present disclosure. The oxidation process 40 can be implemented on a workpiece 50, such as a silicon semiconductor water. The oxidation process 40 can be used to form an oxide layer (e.g., $SiO_2$ layer) on the workpiece 50 to be used, for instance, as an insulating layer in a semiconductor device.

A pre-treatment oxidation process 60 can be implemented on the workpiece 50 to grow a high quality oxide layer 55 on the workpiece 50. The high quality oxide layer 55 can serve as a template for later oxide growth on the workpiece 50. As will be discussed in more detail below, the pre-treatment oxidation process 60 can include exposing the workpiece 50 to a pretreatment gas, such as an $O_3$ gas, an $O_2$ gas, or a gas comprising a mixture of $O_3$ and $O_2$. The pre-treatment oxidation process 60 can also include exposing the workpiece 50 to radicals generated in a remote plasma source from a pretreatment gas, such as such as an $O_2$ gas, an $O_3$ gas, or a gas comprising a mixture of $O_3$ and $O_2$.

After the pre-treatment oxidation process 60, a remote plasma oxidation process 70 can be implemented to grow oxide layer 57 on the high quality oxide layer 55. The remote plasma oxidation process 70 can expose the workpiece 50 to radicals (e.g., O radicals or OH radicals) generated from a plasma induced in a remote plasma chamber. The plasma can be generated from the remote plasma in a process gas. The process gas can include, for instance, a mixture comprising $H_2$ and $O_2$ or a mixture comprising a $H_2O$ and $O_2$. The process can include filtering species (e.g., ions) generated in the plasma using a separation grid separating the plasma chamber from a processing chamber. Radicals (e.g., O radicals and/or OH radicals) can pass through the separation grid for exposure to the workpiece to form an oxide layer on the workpiece 50.

Figure 2:
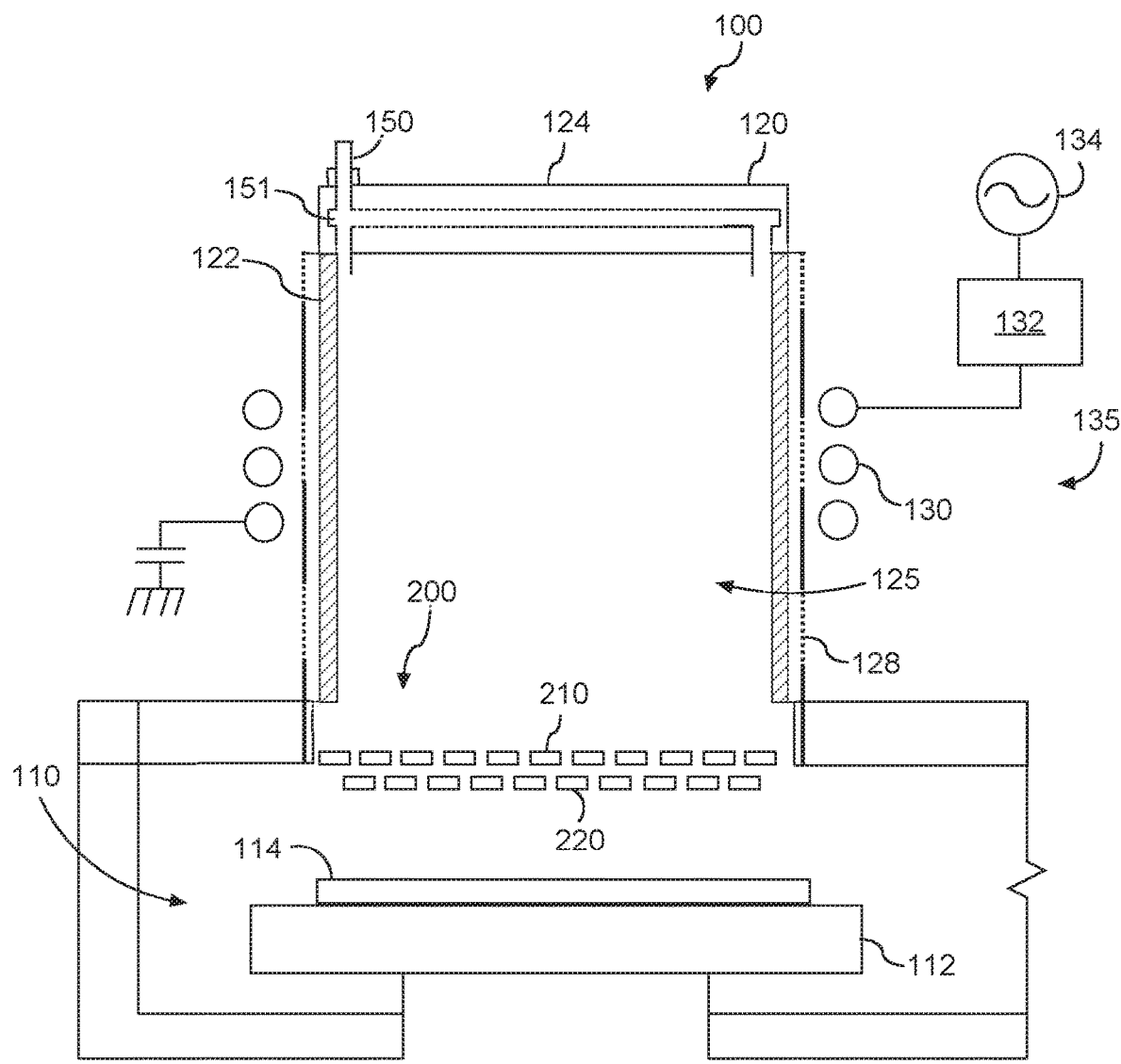
FIG. 2 depicts an example plasma processing apparatus according to example embodiments of the present disclosure.

FIG. 2 depicts an example plasma processing apparatus 100 that can be used to implement aspects of the oxidation process(es) according to example embodiments of the present disclosure. As illustrated, the plasma processing apparatus 100 includes a processing chamber 110 and a plasma chamber 120 that is separated from the processing chamber 110. The processing chamber 110 includes a substrate holder or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, the ceiling 124, and the separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and/or carrier gases) can be provided to the chamber interior from a gas supply 150 and an annular gas distribution channel 151 or other suitable gas introduction mechanism. When the induction coil 130 is energized with RF power from the RIF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, the separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid 200. Neutrals (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 3:
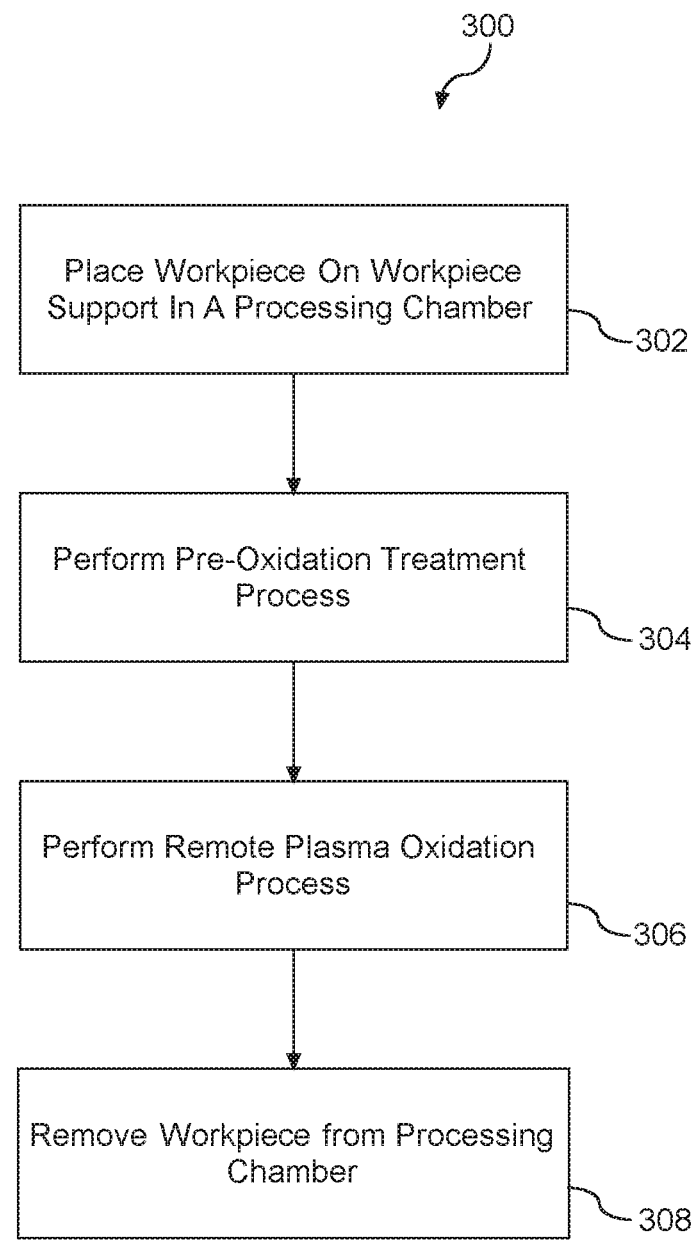
FIG. 3 depicts a flow diagram of an example method according to example embodiments of the present disclosure.

FIG. 3 depicts a flow diagram of an example method (300) for processing a workpiece according to example embodiments of the present disclosure. The method (300) can be implemented using the plasma processing apparatus 100. However, the method(s) according to example aspects of the present disclosure can be implemented using other approaches without deviating from the scope of the present disclosure. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the method can include placing a workpiece on a workpiece support in a processing chamber. For instance, a workpiece 114 can be placed on pedestal 112 in the processing chamber 110 of plasma processing apparatus 100. The workpiece 114 can include a semiconductor substrate, such as silicon or silicon germanium. The method (300) can be used to form an oxide layer (e.g., $SiO_2$) on the workpiece.

At (304), the method can include a performing pre-oxidation treatment process on the workpiece. For instance, a pre-oxidation treatment process can be performed on the workpiece 114 in the processing chamber 110 of plasma processing apparatus 100. The pre-oxidation treatment process can initiate oxide layer formation on the workpiece. For instance, the pre-oxidation treatment process can form a thin high quality oxide layer on the workpiece that can serve as a template for later oxide formation on the workpiece. Details concerning example pre-oxidation treatment process (s) will be discussed with references to FIGS. 4-7 below.

At (306), the method can include performing a remote plasma oxidation process on the workpiece. For instance, the remote plasma oxidation process can be performed on the workpiece 114 in the processing chamber 110 of plasma processing apparatus 100. The remote plasma oxidation process can be implemented in a low temperature regime (e.g., less than 400° C.). The remote plasma oxidation process can expose the workpiece to radicals generated in a remote plasma source for oxide formation on the workpiece. Details concerning example remote plasma oxidation process(es) will be discussed with reference to FIG. 8 below.

At (308), the method can include includes removing the workpiece from the processing chamber. For instance, the workpiece 114 can be removed from the processing chamber 110 of the plasma processing apparatus 100 after completion of the pre-oxidation treatment process and the remote plasma oxidation process.

Figure 4:
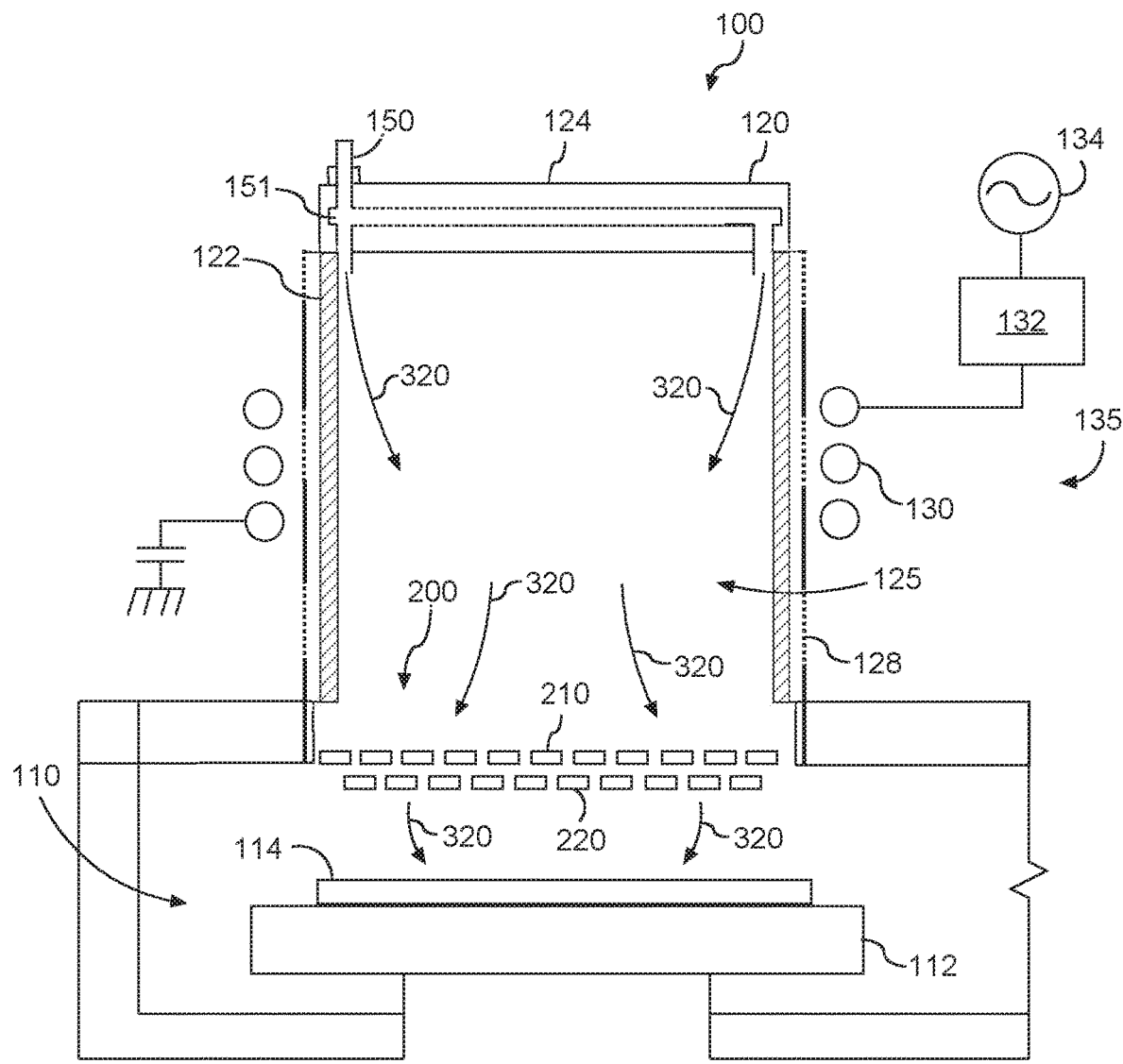
FIG. 4 depicts example exposure of a workpiece to a pretreatment gas according to example embodiments of the present disclosure.

FIG. 4 depicts an example pre-treatment oxidation process that can be implemented by exposing a workpiece to pretreatment gas according to example embodiments of the present disclosure. More particularly, FIG. 4 depicts a workpiece 114 in the processing chamber 110 of the plasma processing apparatus 100 of FIG. 1. During the pre-oxidation pretreatment process, a pretreatment gas can be exposed to the workpiece 114 in the processing chamber.

For example, as shown in FIG. 4, a pretreatment gas 320 can be introduced to the plasma processing apparatus 100 via the plasma chamber 120. The pretreatment gas can flow from a gas source (not illustrated) through the plasma chamber 120 to the processing chamber 110 through the separation grid assembly 200. The separation grid assembly 200 can act as a showerhead for distribution of the pretreatment gas 320 across the surface of the workpiece 114 in the processing chamber. No plasma is generated in the plasma source during the pre-oxidation treatment process.

The pretreatment gas 320 can include, for instance, an $O_3$ gas. The pretreatment gas 320 can include, for instance, an $O_2$ gas. The pretreatment gas 320 can include, for instance, a mixture of an $O_2$ gas and an $O_3$ gas.

Figure 5:
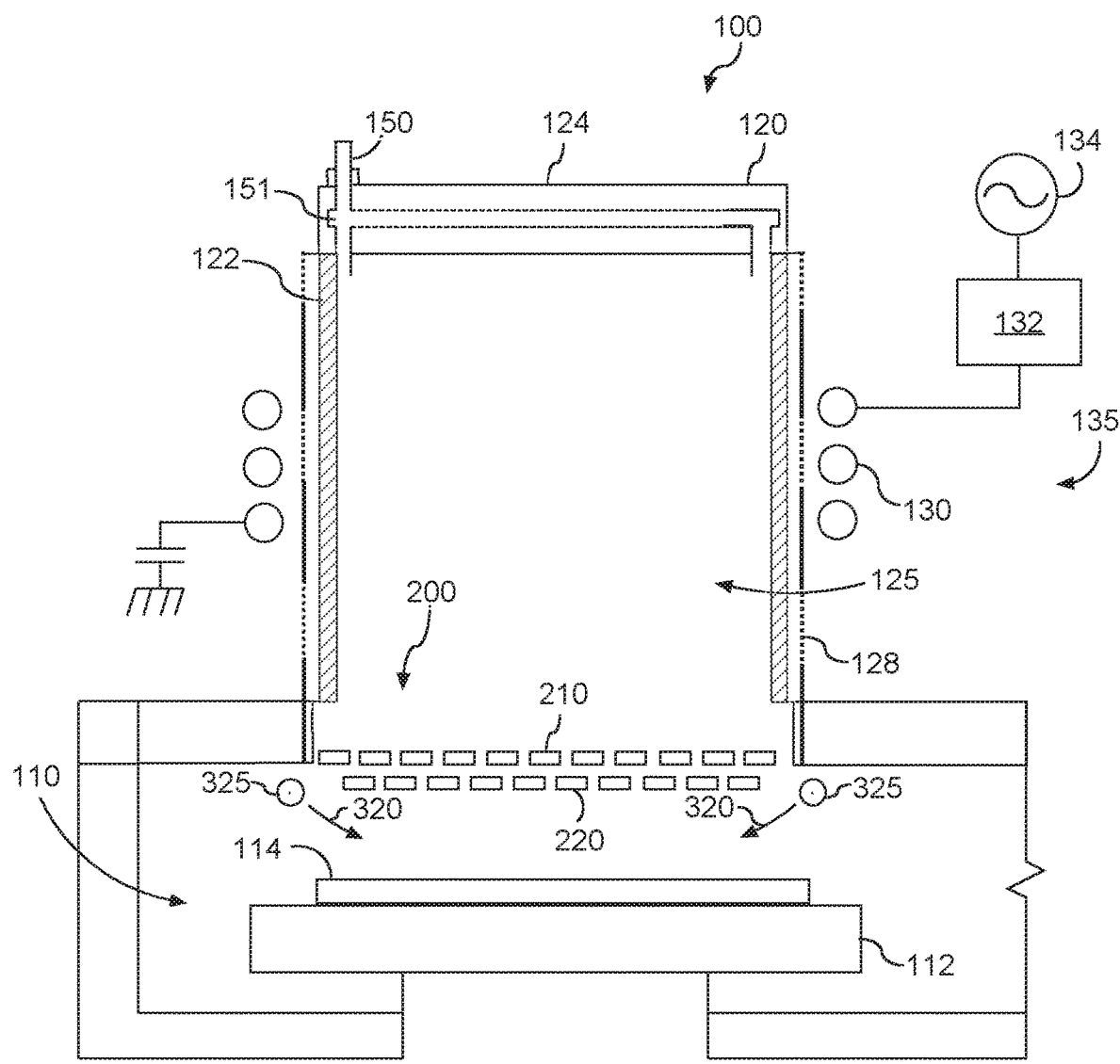
FIG. 5 depicts example exposure of a workpiece to a pretreatment gas according to example embodiments of the present disclosure.

Example process parameters for exposing a workpiece to a pretreatment gas as part of a pre-treatment oxidation process are provided below:

Pretreatment Gas: $O_3$
Carrier Gas: $O_2$ and/or $N_2$ and/or Ar and/or He
Process Pressure: about 100 mTorr to about 18000 mTorr
Workpiece Temperature: about 25° C. to about 400° C.
Process Period: about 10 seconds to about 1200 seconds
Gas Flow Rates for Process Gas: 1000 sccm to 20000 sccm
$O_3$ concentration: 0.1% to 50% by weight:

The pretreatment gas 320 can be exposed to the workpiece in other ways without deviating from the scope of the present disclosure. For example, FIG. 5 depicts delivery of the pretreatment gas 320 from a gas injection port 325 directly to the processing chamber 110 for exposure to the workpiece 114. In this example embodiment, the pretreatment gas 320 does not flow directly through the plasma chamber 120.

Figure 6:
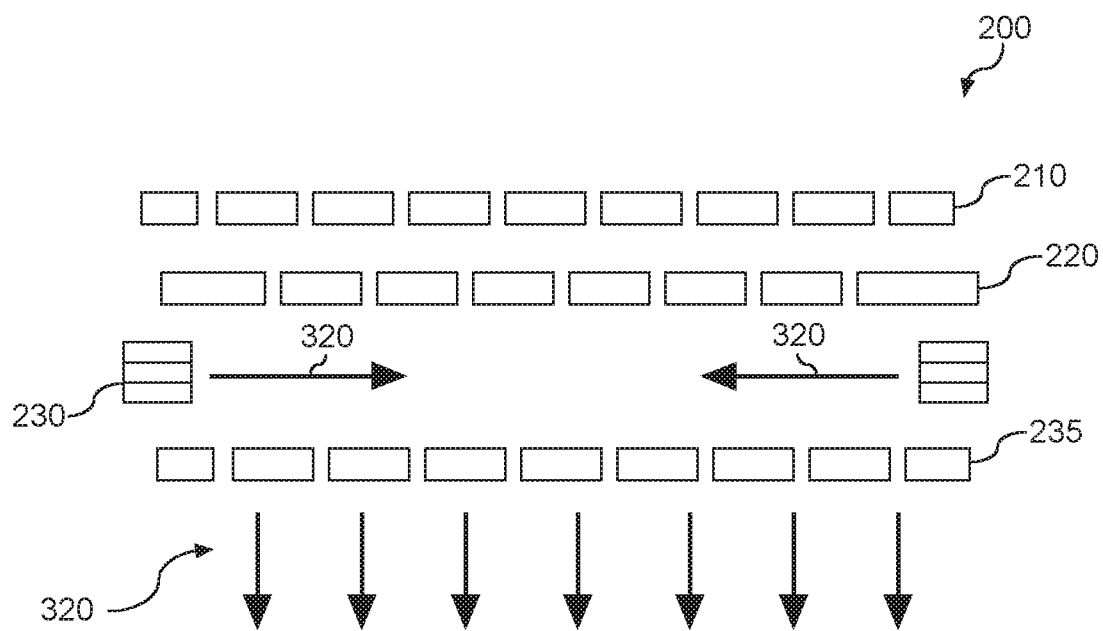
FIG. 6 depicts example injection of a pretreatment gas at a separation grid according to example embodiments of the present disclosure.

In some embodiments, the pretreatment gas 320 can be injected at a location in the plasma processing apparatus downstream of the remote plasma chamber at or below the separation grid assembly 200. For instance, FIG. 6 depicts an example separation grid 200 for injection of a pretreatment gas 320 in a pre-oxidation treatment process according to example embodiments of the present disclosure. More particularly, the separation grid 200 includes a first grid plate 210 and a second grid plate 220 disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Neutral and charged particles 215 from the plasma can be exposed to the separation grid 200. Charged particles (e.g., ions) can recombine on the walls in their path through the holes of each grid plate 210, 220 in the separation grid 200. Subsequent to the second grid plate 220, a gas injection source 230 can be configured to admit pretreatment gas 320 into the processing apparatus. The pretreatment gas 320 can pass through a third grid plate 235 for exposure to the workpiece.

The present example is discussed with reference to a separation grid with three grid plates for example purposes. Those of ordinary skill in the art, using the disclosures provided herein, will understand that more or fewer grid plates can be used without deviating from the scope of the present disclosure.

Figure 7:
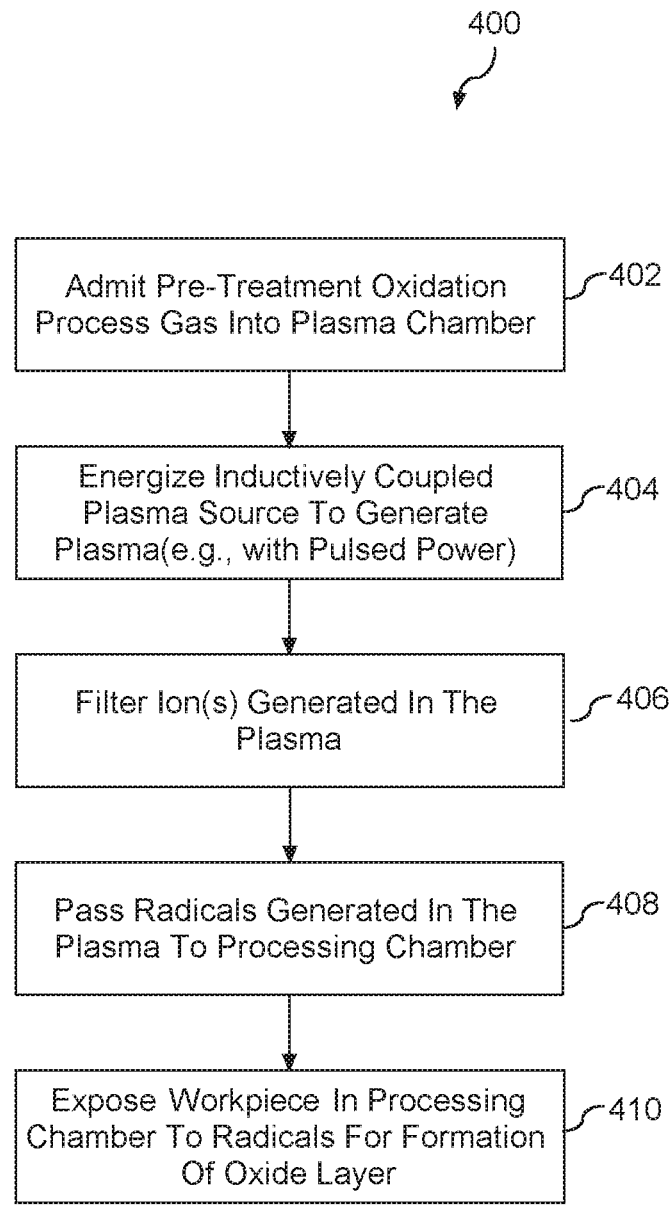
FIG. 7 depicts a flow diagram of an example pre-oxidation treatment process according to example embodiments of the present disclosure.

FIG. 7 depicts a flow diagram of an example method (400) for conducting a pre-oxidation treatment process according to example embodiments of the present disclosure. The method (400) can be implemented using the plasma processing apparatus 100. However, the method(s) according to example aspects of the present disclosure can be implemented using other approaches without deviating from the scope of the present disclosure, FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (402), the method can include admitting a pre-treatment oxidation process gas into a plasma chamber. For instance, a pre-treatment oxidation process gas can be admitted into the plasma chamber 120 of plasma processing apparatus 100. The pre-treatment oxidation process gas can include, for instance, an $O_2$ gas. The pre-treatment oxidation process gas can include, for instance, an $O_3$ gas. The pre-treatment oxidation process gas can include, for instance, a mixture of $O_2$ and $O_3$. The pre-treatment oxidation process gas, in some embodiments, does not include hydrogen.

At (404), the method can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired radicals with reduced plasma energy. The plasma can generate species from the pre-treatment oxidation process gas.

At (406), the method can include filtering one or more ions generated by the plasma in the mixture to create a filtered mixture. In some embodiments, the one or more ions can be filtered using a separation grid assembly separating the plasma chamber from a processing chamber where the workpiece is located. For instance, the separation grid 200 can be used to filter ions generated by the plasma. The separation grid 200 can have a plurality of holes. Charged particles (e.g., ions) can recombine on the walls in their path through the plurality of holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (408), radicals (e.g., neutral O radicals) generated in the plasma can be passed through to the processing chamber. For instance, the radicals can pass through the separation grid separating the plasma chamber from the processing chamber for exposure to a workpiece.

At (410), the method can include exposing the workpiece in the processing chamber to radicals for formation of an oxide layer. The oxide layer can be a thin layer of high quality oxide (e.g., $SiO_2$) formed on the workpiece. The oxide layer can serve as a template for later oxide formation during a remote plasma oxidation process.

Figure 8:
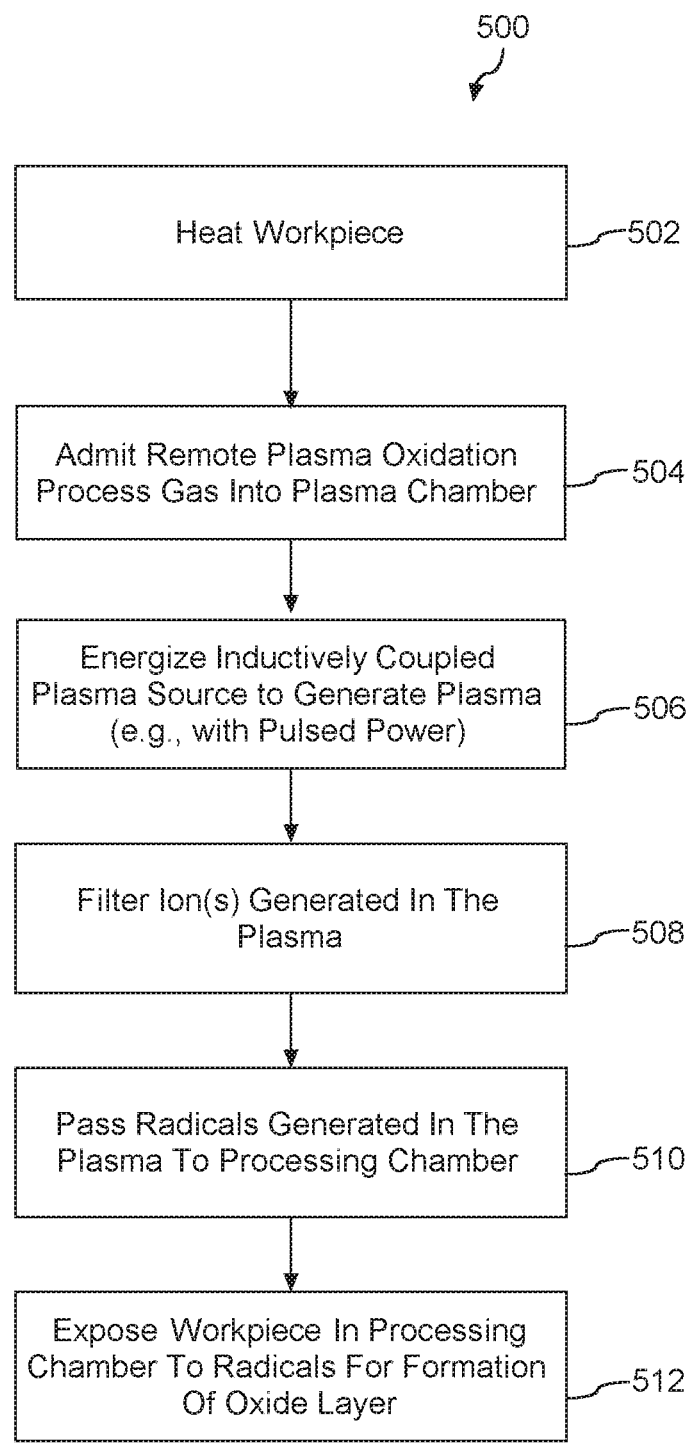
FIG. 8 depicts a flow diagram of an example remote plasma oxidation process according to example embodiments of the present disclosure.

Example process parameters for a pre-oxidation treatment process according to the method of FIG. 7 are provided below:
Pretreatment Gas: $O_2$
Carrier Gas: $N_2$ and/or Ar and/or He
Process Pressure: about 100 mTorr to about 510000 mTorr
Workpiece Temperature: about 25° C. to about 400° C.
Source Power: 500 W to 5500 W
Process Period: about 1 second to about 1200 seconds
Gas Flow Rates for $O_2$ Gas: 100 sccm to 20000 sccm FIG. 8 depicts a flow diagram of an example method (500) for implementing a remote plasma oxidation process according to example embodiments of the present disclosure. The method (400) can be implemented using the plasma processing apparatus 100. However, the method(s) according to example aspects of the present disclosure can be implemented using other approaches without deviating from the scope of the present disclosure. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (502), the method can include heating a workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 20° C. to about 400° C.

At (504), the method can include admitting a remote plasma oxidation process gas into a plasma chamber. For instance, a remote plasma oxidation process gas can be admitted into the plasma chamber 120 of plasma processing apparatus 100. In some embodiments, the process gas can include, for instance, a mixture comprising $H_2$ and $O_2$ or a mixture comprising a $H_2O$ and $O_2$.

At (506), the method can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired radicals with reduced plasma energy. The plasma can generate species from the process gas.

At (508), the method can include filtering one or more ions generated by the plasma in the mixture to create a filtered mixture. In some embodiments, the one or more ions can be filtered using a separation grid assembly separating the plasma chamber from a processing chamber where the workpiece is located. For instance, the separation grid 200 can be used to filter ions generated by the plasma. The separation grid 200 can have a plurality of holes. Charged particles (e.g., ions) can recombine on the walls in their path through the plurality of holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (510), radicals (e.g., neutral O radicals, neutral OH radicals) generated in the plasma can be passed through to the processing chamber. For instance, the radicals can pass through the separation grid separating the plasma chamber from the processing chamber for exposure to a workpiece.

At (512), the method can include exposing the workpiece in the processing chamber to radicals for formation of an oxide layer. The quality of the oxide layer formed during the remote oxidation process can be improved as a result of the thin layer of high quality oxide formed on the workpiece during the pre-oxidation treatment process.

Example process parameters for a remote plasma oxidation process are provided below:
Process Gas: $O_2+H_2$
Carrier Gas: $N_2$ and/or Ar and/or He
Process Pressure: about 100 mTorr to about 8000 mTorr
Workpiece Temperature: about 25° C. to about 400° C.
Source Power: 1500 W to 5500 W
Process Period: about 30 seconds to about 1200 seconds
Gas Flow Rates for Process Gas:
$O_2$: 1000 sccm to 15000 sccm
$H_2$: 1000 sccm to 15000 sccm The oxidation processes according to example aspects of the present disclosure can be implemented in other suitable plasma processing apparatus. For instance, oxidation processes according to example embodiments of the present disclosure can be implemented using the example apparatus shown in FIG. 9 and the example apparatus shown in FIG. 10 discussed in detail below.

Figure 9:
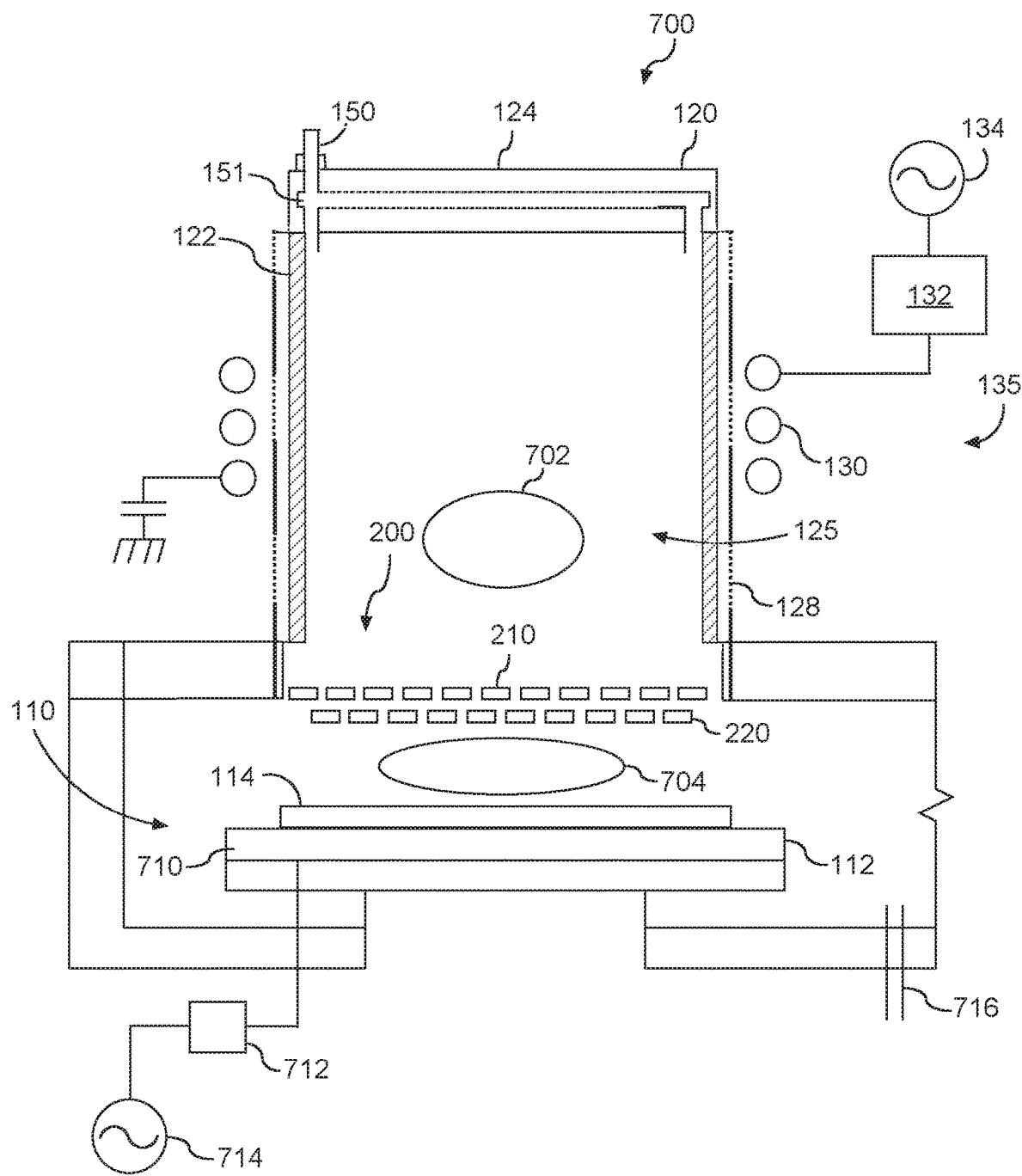
FIG. 9 depicts an example plasma processing apparatus according to example embodiments of the present disclosure.

FIG. 9 depicts an example plasma processing apparatus 700 that can be used to implement processes according to example embodiments of the present disclosure. The plasma processing apparatus 700 is similar to the plasma processing apparatus 100 of FIG. 2.

More particularly, plasma processing apparatus 700 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 2 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 9, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 700 of FIG. 9 is operable to generate a first plasma 702 (e.g., a remote plasma) in the plasma chamber 120 and a second plasma 704 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 700 of FIG. 9 includes a bias source having bias electrode 710 in the pedestal 112. The bias electrode 710 can be coupled to an RF power generator 714 via a suitable matching network 712. When the bias electrode 710 is energized with RF energy, a second plasma 704 can be generated from a mixture in the processing chamber 110 for direct exposure to the workpiece 114. The processing chamber 110 can include a gas exhaust port 716 for evacuating a gas from the processing chamber 110.

Figure 10:
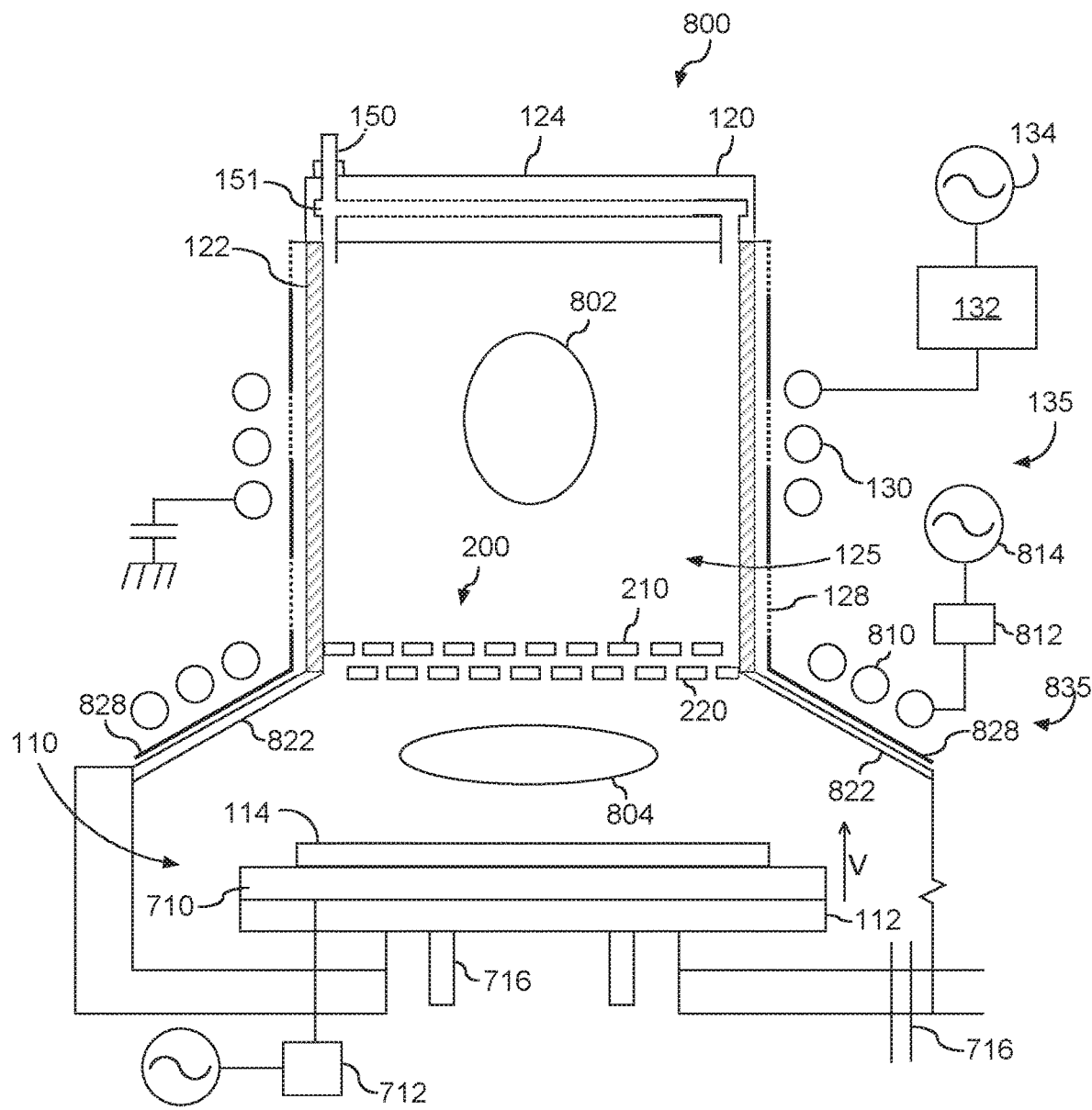
FIG. 10 depicts an example plasma processing apparatus according to example embodiments of the present disclosure.

FIG. 10 depicts a processing chamber 800 similar to that of FIG. 2 and FIG. 9. More particularly, plasma processing apparatus 800 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 10, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 9 is operable to generate a first plasma 802 (e.g., a remote plasma) in the plasma chamber 120 and a second plasma 804 (e.g., a direct plasma) in the processing chamber 110. As shown, the plasma processing apparatus 800 can include an angled dielectric sidewall 822 that extends from the dielectric side wall 122 associated with the remote plasma chamber 120. The angled dielectric sidewall 822 can form a part of the processing chamber 110.

A second inductive plasma source 835 can be located proximate the dielectric sidewall 822. The second inductive plasma source 835 can include an induction coil 810 coupled to an RF generator 814 via a suitable matching network 812. The induction coil 810, when energized with RF energy, can induce a direct plasma 804 from a mixture in the processing chamber 110. A Faraday shield 828 can be disposed between the induction coil 810 and the sidewall 822.

The pedestal 112 can be movable in a vertical direction V. For instance, the pedestal 112 can include a vertical lift 816 that can be configured to adjust a distance between the pedestal 112 and the separation grid assembly 200. As one example, the pedestal 112 can be located in a first vertical position for processing using the remote plasma 802. The pedestal 112 can be in a second vertical position for processing using the direct plasma 804. The first vertical position can be closer to the separation grid assembly 200 relative to the second vertical position.

The plasma processing apparatus 800 of FIG. 9 includes a bias source having bias electrode 710 in the pedestal 112. The bias electrode 710 can be coupled to an RF power generator 714 via a suitable matching network 712. The processing chamber 110 can include a gas exhaust port 716 for evacuating a gas from the processing chamber 110.

Figure 11:
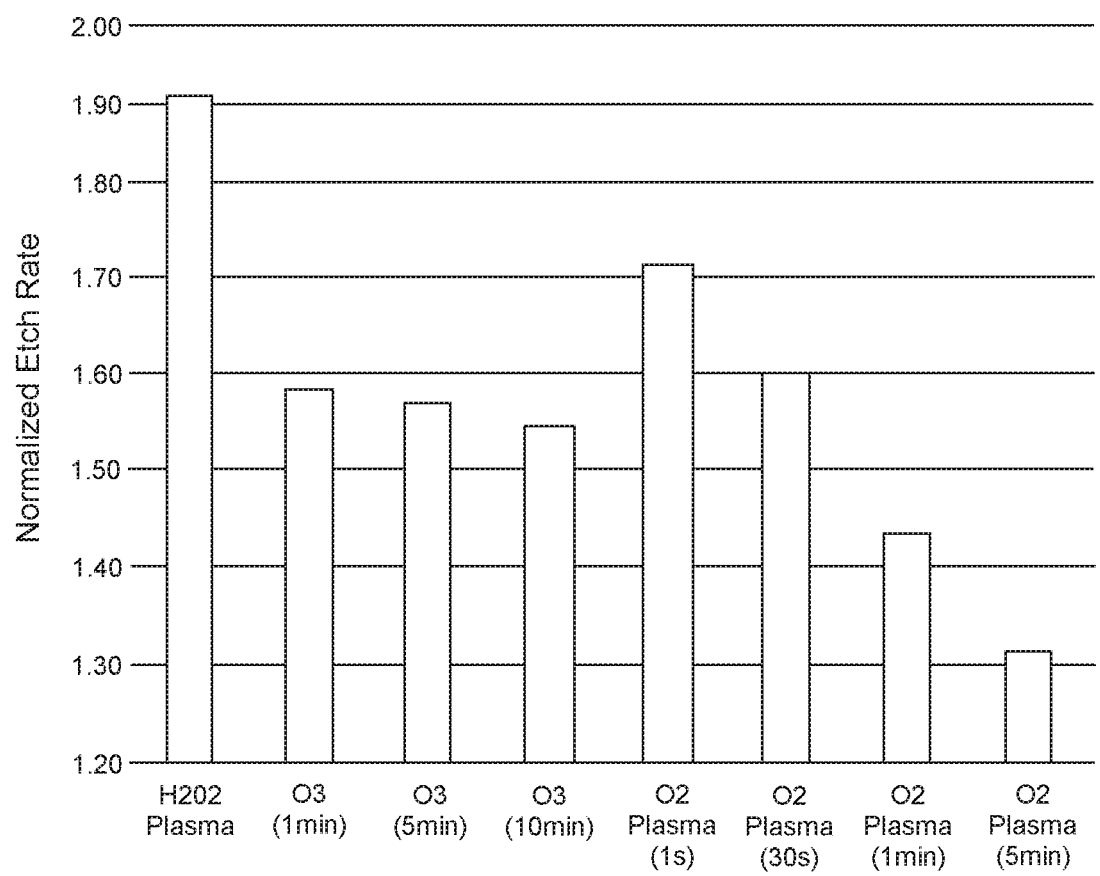
FIG. 11 depicts an example test result associated with pre-oxidation treatment processes according to example embodiments of the present disclosure.

FIG. 11 depicts example process results according to example embodiments of the present disclosure. FIG. 11 depicts quality of oxide in terms of normalized etch rate. Process conditions for the different processes are provided below:

Remote Plasma Oxidation $H_2+O_2$ Plasma (No Pre-Oxidation Treatment)
    15% $H_2$; 85% $O_2$
    Total Flow Rate: 10 slm
    Source Power: 3500 W
    Pressure: 900 mT
    Temperature: 325° C.
    Process Time: 600 s
$O_3$ Pre-Oxidation Treatment (No Plasma)
    19% $O_3$+Carrier Gas
    Pressure: 1 T
    Total Flow Rate: 500 sccm
    Temperature: 325° C.
    Process Time: as indicated
$O_2$ Plasma Pre-Oxidation Treatment
    Total Flow Rate for $O_2$ Gas: 10 slm
    Pressure: 900 mT
    Source Power 2500 W
    Temperature: 325° C.
    Process Time: as indicated As demonstrated in FIG. 11, use of a pre-oxidation treatment process can result in improvement of oxide quality when compared to remote plasma oxidations processes with no pre-oxidation treatment process.

While the present subject matter has been described in detail with respect to specific example embodiments thereof it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, comprising:
placing a workpiece on a workpiece support in a processing chamber, the processing chamber separate from a plasma chamber by a separation grid having a first grid plate and a second grid plate;
performing a pre-oxidation treatment process on the workpiece in the processing chamber to initiate oxide layer formation on the workpiece, the pre-oxidation treatment process comprising flowing a pretreatment gas through a gas injection source disposed between the first grid plate and the second grid plate;
performing a remote plasma oxidation process on the workpiece in the processing chamber to continue the oxide layer formation on the workpiece;
subsequent to performing the pre-oxidation treatment process and the remote plasma oxidation process, removing the workpiece from the processing chamber;
wherein the remote plasma oxidation process comprises:
generating a first plasma from a remote plasma oxidation process gas in a plasma chamber;
filtering species generated in the first plasma to generate a mixture having one or more radicals; and
exposing the radicals to the workpiece.

2. The method of claim 1, wherein the pre-oxidation treatment process forms a first oxide layer on the workpiece and the remote plasma oxidation process forms a second oxide layer on the first oxide layer.

3. The method of claim 1, wherein the remote plasma oxidation process gas comprises a mixture comprising $H_2$ and $O_2$ or a mixture comprising a $H_2O$ and $O_2$.

4. The method of claim 1, wherein the pre-oxidation treatment process comprises:
generating one or more species by inducing a second plasma in the pretreatment gas in the plasma chamber;
filtering the one or more species to generate a filtered mixture; and
exposing the filtered mixture to the workpiece to initiate oxide layer formation on the workpiece.

5. The method of claim 4, wherein the pretreatment gas comprises $O_2$ or $O_3$.

6. The method of claim 1, wherein the pre-oxidation treatment process comprises exposing the workpiece to a pretreatment gas in the processing chamber, the pretreatment gas comprising $O_3$.

7. The method of claim 6, wherein the pretreatment gas comprises $O_2$ and $O_3$.

8. The method of claim 1, wherein the first plasma is generated using an inductively coupled plasma source.

9. The method of claim 1, wherein the workpiece is at a temperature of less than about 400° C. during the remote plasma oxidation process.

10. A method for processing a workpiece, comprising:
placing a workpiece on a workpiece support in a processing chamber separated from a plasma chamber by a separation grid having a first grid plate and a second grid plate;
exposing the workpiece to a pretreatment gas in the processing chamber, the pretreatment gas comprising $O_3$, wherein pretreatment gas is supplied via a gas injection source disposed between the first grid plate and the second grid plate;

subsequent to exposing the workpiece to the pretreatment gas, performing a remote plasma oxidation process on the workpiece in the processing chamber, the remote plasma oxidation process exposing the workpiece to O radicals or OH radicals produced at least in part by generating a plasma in a remote plasma chamber; and subsequent to the remote plasma oxidation process, removing the workpiece from the processing chamber.

11. The method of claim 10, wherein the pretreatment gas comprises $O_2$ and $O_3$.

12. The method of claim 10, wherein the separation grid is configured to filter ions generated in the remote plasma chamber.

13. A method for processing a workpiece, comprising:

placing a workpiece on a workpiece support in a processing chamber separated from a plasma chamber by a separation grid having a first grid plate and a second grid plate;

performing a pre-oxidation treatment process on the workpiece in the processing chamber to initiate oxide layer formation on the workpiece;

the pre-oxidation treatment process comprising exposing the workpiece to radicals produced at least in part by generating a first plasma from a first process gas in a remote plasma chamber, wherein the first process gas comprises $O_2$, wherein a third process gas is injected into the radicals by a gas injection source disposed between the first grid plate and the second grid plate;

subsequent to performing the pre-oxidation treatment process, performing a remote plasma oxidation process on the workpiece in the processing chamber, the remote plasma oxidation process exposing the workpiece to O radicals or OH radicals produced at least in part by generating a second plasma from a second process gas in the remote plasma chamber; and subsequent to the remote plasma oxidation process, removing the workpiece from the processing chamber.

14. The method of claim 13, wherein the first process gas comprises $O_3$.

15. The method of claim 13, wherein the second process gas comprises a mixture comprising $H_2$ and $O_2$ or a mixture comprising a $H_2O$ and $O_2$.

16. The method of claim 13, wherein the separation grid is configured to filter ions generated in the remote plasma chamber.

17. The method of claim 13, wherein the first plasma and the second plasma are generated using an inductively coupled plasma source.

18. The method of claim 1, wherein the pretreatment gas comprises $O_3$ and is provided at a flow rate of about 500 sccm, and wherein the workpiece has a processing temperature of about 325° C.

19. The method of claim 13, wherein the first process gas is provided at a flow rate of about 10 slm, and wherein the workpiece has a processing temperature of about 325° C.

20. The method of claim 1, wherein the separation grid comprises a third grid plate, the third grid plate disposed between the first grid plate and the plasma chamber.

* * * * *